United States Patent [19]

Kashio

[11] 4,034,301
[45] July 5, 1977

[54] MEMORY DEVICE WITH SHIFT REGISTER USABLE AS DYNAMIC OR STATIC SHIFT REGISTER

[75] Inventor: Toshio Kashio, Tokyo, Japan

[73] Assignee: Casio Computer Co., Ltd., Tokyo, Japan

[22] Filed: Dec. 23, 1975

[21] Appl. No.: 643,801

[30] Foreign Application Priority Data

Dec. 23, 1974 Japan .............................. 49-146841
Dec. 27, 1974 Japan ................................... 50-529

[52] U.S. Cl. .............................. 328/37; 307/221 C; 307/223 C; 307/224 C
[51] Int. Cl.$^2$ ................... G11C 19/28; G11C 11/40
[58] Field of Search .......... 307/205, 214, 208, 238, 307/220 R, 220 C, 221 R, 221 C, 223 R, 223 C, 224 R, 224 C, 225 R, 225 C, 238; 328/37, 41, 42, 43, 51

[56] References Cited

UNITED STATES PATENTS

| | | | |
|---|---|---|---|
| 3,483,400 | 12/1969 | Washizuka et al. ............ 307/251 X |
| 3,524,077 | 8/1970 | Kaufman .................... 307/221 C X |
| 3,619,642 | 11/1971 | Dunn ............................. 307/221 C |
| 3,648,066 | 3/1972 | Terman ......................... 307/221 C |
| 3,673,390 | 6/1972 | Krebs ............................... 328/37 X |

T913,008 2/1973 Beasoleil ....................... 307/221 C

Primary Examiner—John S. Heyman
Assistant Examiner—Larry N. Anagnos
Attorney, Agent, or Firm—Flynn & Frishauf

[57] ABSTRACT

An information memory device comprising a plurality of register units each formed of an N number of memory elements alternately cascade connected, an N number of corresponding transfer elements and designed to be stored with an (N-1) number of digits, wherein each memory element can be stored with a digit; each transfer element is intended to transfera digit stored in a memory element connected to the input terminal of said transfer element to another memory element connected to the output terminal of said transfer element; a shift pulse generator is provided which is designed to supply each of the N number of transfer elements with a shift pulse in succession starting with the transfer element disposed on the output side of the register unit, with the phase of a shift pulse changed each time, thereby enabling one digit to be stored by a combination of one memory element and one transfer element, and also an (N-1) number of digits to be stored while being shifted in the register units by an N number of shift pulses delivered from the shift pulse generator.

2 Claims, 9 Drawing Figures

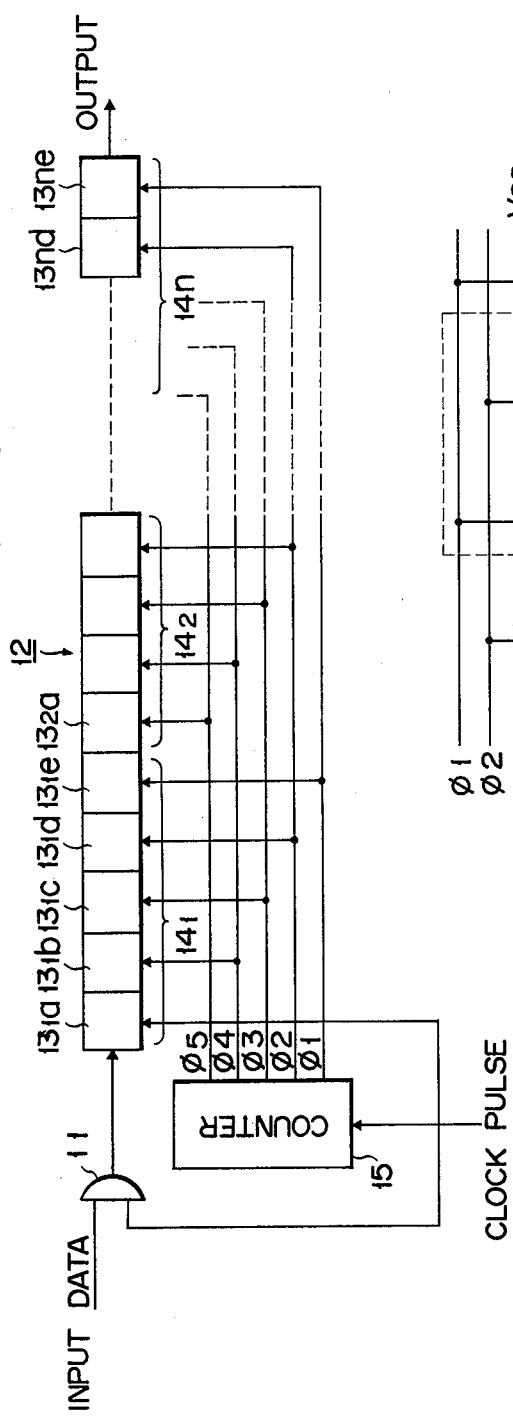

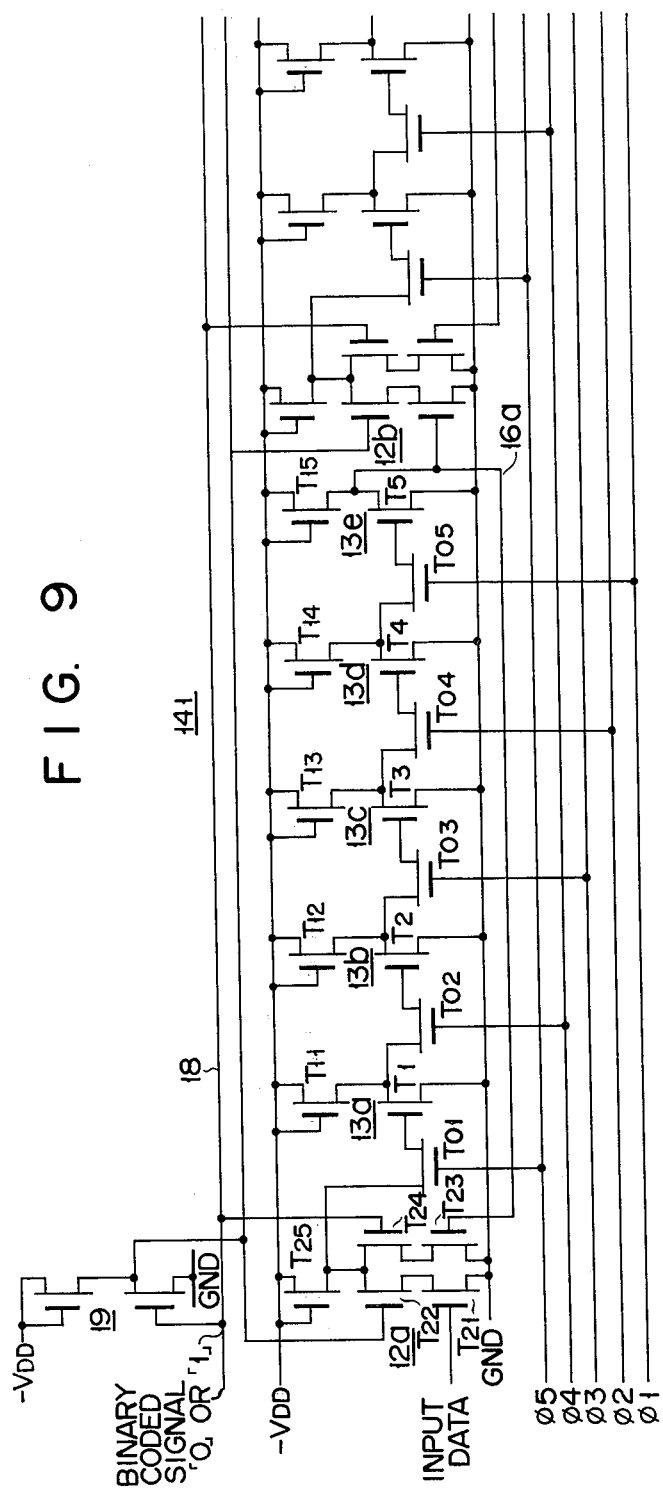

MEMORY DEVICE WITH SHIFT REGISTER USABLE AS DYNAMIC OR STATIC SHIFT REGISTER

BACKGROUND OF THE INVENTION

This invention relates to a memory device which decreases the required number of elements per bit, thereby enabling a large amount of information to be stored with a simplified arrangement.

A known device for storing information being transmitted consists of, for example, a 2-phase type shift register. The shift register comprises numerous cascade-connected memory units, in each of which information supplied is written upon receipt of a clock pulse $\phi_1$ and from each of which information stored is read out upon receipt of a clock pulse $\phi_2$, the arrangement of said shift register being schematically shown in, for example, FIG. 1. That portion of FIG. 1 showing the prior art memory device which is enclosed in broken lines represents one memory unit designed to store one bit. This memory unit has two transfer elements 1, 2 whose gates are each opened upon receipt of two clock pulses $\phi_1$, $\phi_2$ having different phases. Under this arrangement, information received is conducted upon receipt of a clock pulse $\phi_1$ to a first memory element 3 constituted by a field effect transistor through a transfer element 1, and the information stored in said first memory element 3 is read out upon receipt of a clock pulse $\phi_2$ to be shifted to the immediately following memory element 4. Namely, the information stored in the above-mentioned memory unit enclosed in the broken lines is read out from the memory element 4.

The prior art memory device arranged as described above requires at least two memory elements and two transfer elements. If, therefore, used to store a large amount of information, such conventional memory device would be bulky and expensive. If an attempt is made to use said memory device in place of, for example, a card or tape for storage of information, then the memory device would present difficulties in increasing its capacity and fail to be effectively applied.

SUMMARY OF THE INVENTION

It is accordingly an object of this invention to provide an information memory device which is free from the drawbacks of the prior art memory device and enables information consisting of an (n−1) number of bits (N is taken to denote 3 or larger numbers) to be stored and transferred by a combination of an N number of memory elements and an N number of transfer elements, thereby decreasing the required number of memory elements and consequently storing and transferring a large amount of information with a more simplified arrangement than in the known memory device.

Another object of the invention is to provide an information memory device in which a shift register comprises a plurality of cascade connected register units, which are alternately coupled to a plurality of memory elements and a plurality of transfer elements, and a shift circulation circuit and input changeover circuit are further provided for each register unit to allow the shift register to be selectively used as a static or dynamic type.

To attain the above-mentioned object, this invention provides an information memory device which comprises a shift register consisting of a plurality of cascade connected register units each having an N number of memory elements capable of storing digits and an N number of transfer elements designed to shift, upon receipt of a shift pulse, information stored in a memory element connected to the input terminal of the corresponding transfer element to a memory element connected to the output terminal of said transfer element, thereby storing an (N−1) number of digits; and a shift pulse generator for supplying a shift pulse to each transfer element starting with the transfer element disposed on the output side of the register unit with the phase of a shift pulse changed each time. According to this invention, an (N−1) number of memory elements included in an N number of memory elements are each stored with one bit. In each memory unit, a shift pulse is transferred from the memory element to the transfer element, with the phase of said shift pulse changed each time. This operation starts with the output side memory unit. Thus one bit can be stored and transferred by a plurality of serially arranged combinations of one memory element and one transfer element, thereby decreasing the required number of memory elements of an information memory device and in consequence storing and transmitting a large amount of information with a more simplified arrangement than in the prior art information memory device.

The information memory device of this invention comprises a plurality of cascade-connected register units, and is further provided with shift circulation circuits for shifting a signal from the output terminal to the input terminal of each register unit; and also with an input changeover gating circuit to determine, upon receipt of fresh information at the input side register unit, whether the memory device should be used as a dynamic shift register or a static shift register. In the latter case input information is circulated through the shift register via the shift circulation circuits. As previously described, this invention enables information consisting of an (N−1) number of bits to be stored and transferred by a combination of an N number of memory elements and an N number of transfer elements, thereby decreasing the required number of memory elements, and also allowing the shift register consisting of a plurality of cascade connected register units to be selectively used as a dynamic or static type.

BRIEF DESCRIPTION OF THE DRAWING

FIG. 1 is a circuit arrangement of the prior art shift register;

FIG. 2 is a block circuit diagram of an embodiment of this invention;

FIGS. 6 to 9 show the concrete circuit arrangement of a shift register according to another embodiment of the invention.

DETAILED DESCRIPTION OF THE PREFERRED EMBODIMENTS

There will now be described by reference to the appended drawings an information memory device embodying this invention. FIG. 2 shows the case of storing 4 bits for each character, in which the information memory device of the invention can be effectively applied. Coded characters of information are successively supplied to an AND circuit 11, an output from which is stored in a memory device 12. This memory device 12 is constituted by a plurality of serially arranged register units $14_1$ to $14_n$, each of which comprises five memory units $13_{1a} - 13_{1e}$ to $13_{na} - 13_{ne}$, which are formed of, for example, metal oxide semiconductors (abbreviated as "MOS"). When supplied with a shift pulse, the memory units, for example, $13_{1a} - {}_{13le}$ receive information successively read out from the respective preceding memory units. The subject memory device 12 is provided with a 5-scale counter 15 for counting clock pulses. The 5-scale counter 15 successively gives forth five shift pulses $\phi_1$ to $\phi_5$ by circulation for each advance of counting. The shift pulse $\phi_1$ is supplied to the memory units $13_{1e}$ to $13_{ne}$; the shift pulse $\phi_2$ to the memory units $13_{1d}$ to $13_{nd}$; and similarly the shift pulse $\phi_5$ to the memory units $13_{1a}$ to $13_{na}$. When supplied with a shift pulse $\phi_5$, the AND circuit 11 has its corresponding gate opened.

With the information memory device of this invention arranged as described above, the register units $14_l$ to $14_n$ each comprising five memory units are respectively designed to store 4-bit information. For example, the register unit $14_l$ has its memory units $13_{1a}$ to $13_{1d}$ respectively stored with 1 bit information. The register unit $14_2$ has its memory units $13_{2a}$ to $13_{2d}$ respectively stored with 1 bit-information. The same condition occurs in the following register units $14_3$ to $14_n$. The memory units $13_{1e}$ to $13_{ne}$ belonging to the respective register units $14_1$ to $14_n$ are left empty. Namely, a plurality of cascade connected memory units are stored with successively supplied characters of information, with any of, for example, five cascade connected memory units left vacant one bit in turn.

Under the above-mentioned condition, a shift pulse $\phi_1$ issued from the counter 15 is transmitted to the empty memory units $13_{1e}$ to $13_{ne}$, allowing information stored in the respective preceding memory units $13_{1d}$ to $13_{nd}$ to be shifted to said empty memory units $13_{1e}$ to $13_{ne}$. Similarly, information stored in the respective register units is shifted, each time any of the following shift pulses $\phi_2$ to $\phi_5$ is given forth. One cycle of issuing the five shift pulses $\phi_1$ to $\phi_5$ causes a piece of information stored in each register unit to be advanced one bit.

Figure 3:
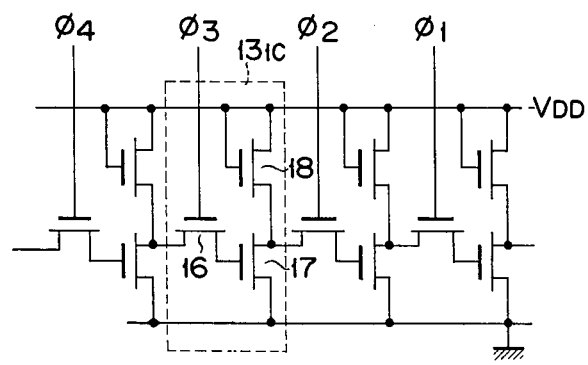
FIGS. 3 to 5 present the fractional circuit arrangement of a register unit.
Figure 4:
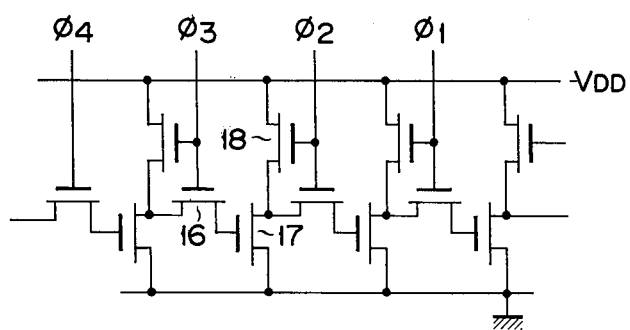
Figure 5:
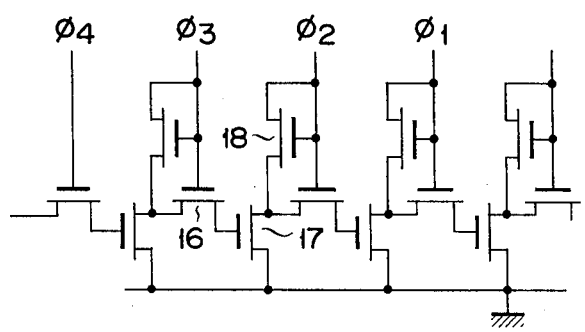

FIGS. 3 to 5 illustrate the fractional circuit arrangement of a register unit. A section enclosed in broken lines shows the arrangement of, for example, a memory unit $13_{lc}$. This memory unit $13_{lc}$ is provided with a transfer element 16 and a memory element 17. The transfer element 16 is formed of a field effect transistor whose gate electrode is supplied with a shift pulse ($\phi_3$ in the case of FIG. 3). The memory element 17 also consists of a field effect transistor acting as an amplifying element whose gate capacity is used to store information. Upon receipt of a shift pulse, the transfer element 16 has its gate opened to supply information stored in the preceding memory element to the gate of the field effect transistor constituting the memory element 17. The storing action of the gate of said field effect transistor is used to store information transmitted through the transfer element 16. Information stored in the memory element 17 is read out to the succeeding memory unit upon receipt of a shift pulse $\phi_2$.

In FIG. 3, a field effect transistor 18 acts as the load resistor of the field effect transistor of the memory element 17, and has its gate normally supplied with a signal by a bias power source $-V_{DD}$. As mentioned above, the memory unit for storing and transmitting one-bit information is formed of one transfer element and one memory element. According to this invention, each memory unit for storing and transferring one bit information is formed of one memory element and one transfer element. Therefore, the shift register as a whole has only to be provided with memory elements in a number equal to half that of memory elements required for the prior art memory device. This arrangement is very effective in storing an increased amount of information.

With the memory unit $13_{lc}$ the field effect transistor 18 acting as a load resistor serves the purpose if connected to the memory element 17 when the gate of the succeeding switching element is opened. As shown in FIG. 4, therefore, the gate of the switching element may be opened when the succeeding memory unit is supplied with a shift pulse. Further as shown in FIG. 5, a shift pulse supplied to the gate of the switching element may be directly used as a bias source to eliminate the necessity of separately providing a bias source $-V_{DD}$. The same effect can be attained by applying a ratioless circuit.

With the information memory device of this invention, a bit signal has its polarity reversed, each time it is shifted from one memory unit to another. Where, therefore, register units each consisting of an odd number of memory units are provided also in an odd number, application of an inverter to a finally read out output enables said output to have the same polarity as when initially supplied.

There will now be described by reference to FIGS. 6 to 9 an information memory device according to another embodiment of this invention.

Figure 6:
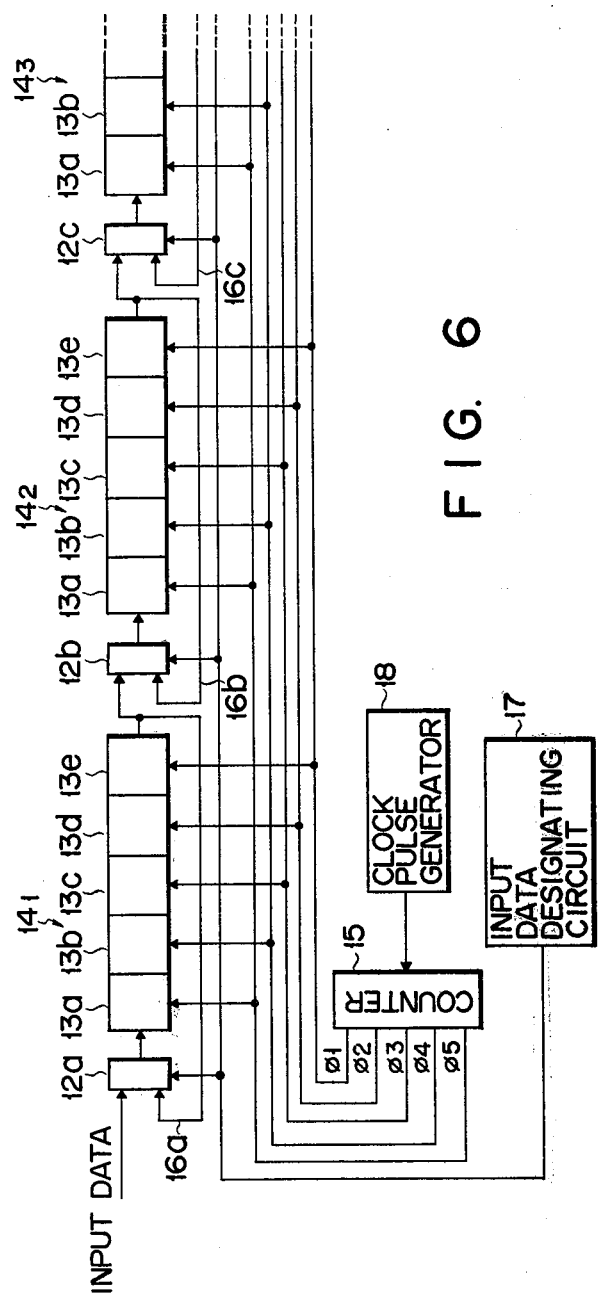

A shift register according to the embodiment of FIGS. 6 to 9 comprises an N number of register units, each of which consists of an N number of memory elements coupled to an N number of transfer elements to store and transfer an (N−1) number of bits, thereby decreasing the required number of memory elements used with the subject information memory device. Further, an input information changeover gate circuit is disposed on the input side of the shift register, and a shift circulation circuit is so provided as to extend from the output side of the shift register to the input side thereof through said input information changeover gate circuit, thereby enaling said shift register to be selectively used as a dynamic or static type. FIG. 6 schematically shows the arrangement of said information memory device. This embodiment is effective where 4 bits are stored for each character. The subject memory device comprises a plurality of cascade-connected register units $14_1$ to $14_n$. These register units $14_l$ to $14_n$ are connected by intervening switching gate circuits $12a$, $12b$ . . . Each of the shift register units $14_l$ to $14_n$ comprises five cascade-connected memory units $13a$ to $13e$ which are controlled by shift pulses $\phi_1$ to $\phi_5$ successively issued at different time intervals. These shift pulses $\phi_1$ to $\phi_5$ are given forth in turn according to the number of clock pulses produced by a clock pulse generator 18 and counter by the 5-scale counter 15.

With the above-mentioned register units $14_1$ to $14_n$, shift circulation circuits $16a$, $16b$ . . . are provided between the output terminals of said register units $14_1$ to $14_n$ and the switching gate circuits $12a$, $12b$ . . . disposed on the input side thereof. When an input-designating circuit 17 gives an instruction to determine whether the shift register as a whole should be used as a dynamic or static type, the switching gate circuits supply the input terminals of the register units $14_l$ to $14_n$ with a signal selected from among signals denoting fresh input information, information shifted from the preceding register unit and output from the shift circulation circuit.

The memory units included in the respective register units are stored with one bit information read out from the respective preceding memory units upon receipt of a shift pulse. Where a character of four bits is stored in the register unit $14_1$ through the switching gate circuit $12a$, said four bits are stored in the memory units $13d$, $13c$, $13b$, $13a$ in turn, starting with the foremost one of said bits. In this case, the memory unit $13e$ is left vacent. Where, under this condition, the 5-scale counter 15 sends forth a shift pulse $\phi_1$, then the vacant memory unit $13e$ receives bit information shifted from the preceding memory unit $13d$, leaving it vacant where a shift pulse $\phi_2$ is issued, then the memory unit $13d$ now left vacant is supplied with bit information shifted from the preceding memory unit $13c$. The memory units are successively supplied with bit information unitl a shift pulse $\phi_5$ is given forth, with said memory units left vacant in turn, thus causing the whole 4-bit information stored in each register unit to be shifted one bit, each time a cycle of issuing shift pulses $\phi_1$ to $\phi_5$ is repeated.

In this case, the register units $14_1$ to $14_n$ are constructed in the same number as in the preceding embodiment and operated in parallel by the shift pulses $\phi_5$. Where, therefore, the memory units are successively stored with 4-bit characters with said memory units left vacant one bit in turn, and the gates of the switching gate circuits $12a$, $12b$ . . . have their gates so controlled as to supply the register units $14_1$ to $14_n$ with a signal shifted from the respective preceding register units, then a series of said register units $14_1$ to $14_n$ collectively constitute a dynamic shift register.

Where the input information designating circuit 17 controls the swtiching gate circuits $12a$, $12b$ . . . to prevent fresh input information or information read out from the respective preceding memory units from being supplied to said switching gate circuits $12a$, $12b$ . . . and delivers bit information from the shift circulation circuits $16a$, $16b$ . . . to the input terminal of the register units $14_1$ to $14_n$ respectively, then bit information stored in the output side memory unit $13e$ of each register unit $14_1$ to $14_n$ is fed back to the input side memory unit $13a$ of the corresponding register unit. As the result, 4-bit information is stored in the register units $14_1$ to $14_n$ by circulating through the corresponding shift circulation circuits $16a$, $16b$ . . . In this case, the information memory device of this invention comprising a plurality of serially connected register units $14_1$ to $14_n$ acts as a static shift register.

Figure 7:
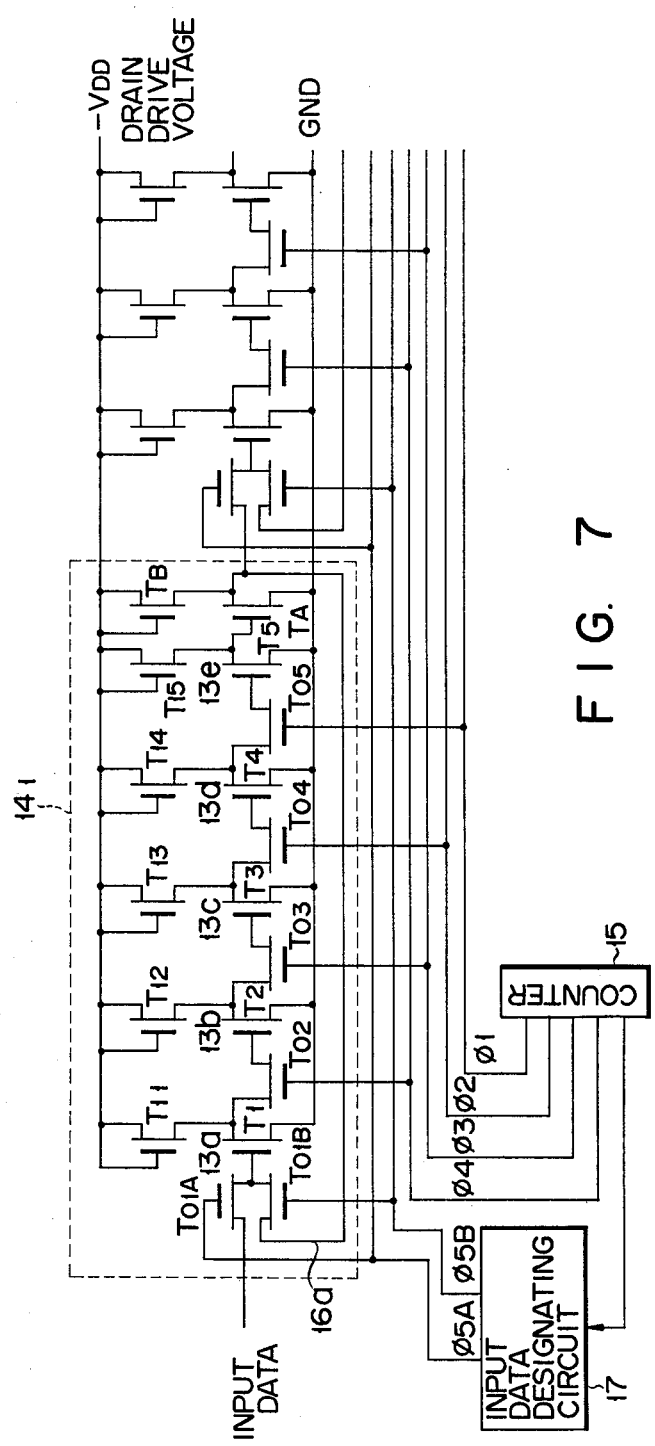

FIG. 7 presents a concrete circuit arrangement of the register units constituting an information memory device according to the embodiment of FIG. 6, particularly showing the construction of the register unit $14_1$. This register unit $14_1$ comprises five memory units $13a$ to $13e$, which are formed of temporary memory elements $T_1$ to $T_5$ of the insulated gate field effect transistor type. These temporary memory elements $T_1$ to $T_5$ are serially connected through intervening transfer elements $T_{02}$ to $T_{05}$ similarly of the insulated gate field effect transistor type. The gate electrodes of said transfer elements $T_{02}$ to $T_{02}$ are supplied with shift pulses $\phi_1$ to $\phi_4$ given forth from the 5-scale counter 15. The input side memory elements $T_1$ is supplied with a signal through one of a pair of switching elements $T_{01A}$, $T_{01B}$. Namely, the switching element $T_{01A}$ is supplied with fresh information and the switching element $T_{01B}$ with information delivered from the shift circulation circuit $16a$. The switching elements $T_{01A}$, $T_{01B}$ perform an action corresponding to that of the swtiching gate circuit $12a$ of FIG. 6 as well as that of a transfer element. The input information-designating circuit 17 issues an instruction to select the dynamic or static operation of the subject information memory device. Upon receipt of said instruction, the clock pulse generator 18 gives forth a control pulse $\phi_{5A}$ or $\phi_{5B}$ corresponding to the shift pulse $\phi_5$, thereby supplying a signal to one of the gates of the switching elements $T_{01A}$ and $T_{01B}$ respectively.

Referring to FIG. 7, the field effect transistor $T_{11}$ to $T_{15}$ act as the load resistors of the memory elements $T_1$ to $T_5$. With memory units $13a$ to $13e$, input information has its polarity reversed, each time it is shifted to the respective succeeding memory units. With a registor units $14l$ formed of five memory units $13a$ to $13e$, an output from the output side memory unit $13e$ has its polarity reversed from input information. Therefore, an output from the memory element $T_5$ of the output side memory unit $13e$ passes through an inverter consisting of a field effect transistor $T_A$ to be given forth from the registor unit $14_1$ with the same polarity as an input supplied to said register unit $14_1$. Referential character $T_B$ denotes the load resistor of a transistor $T_A$.

Figure 8:
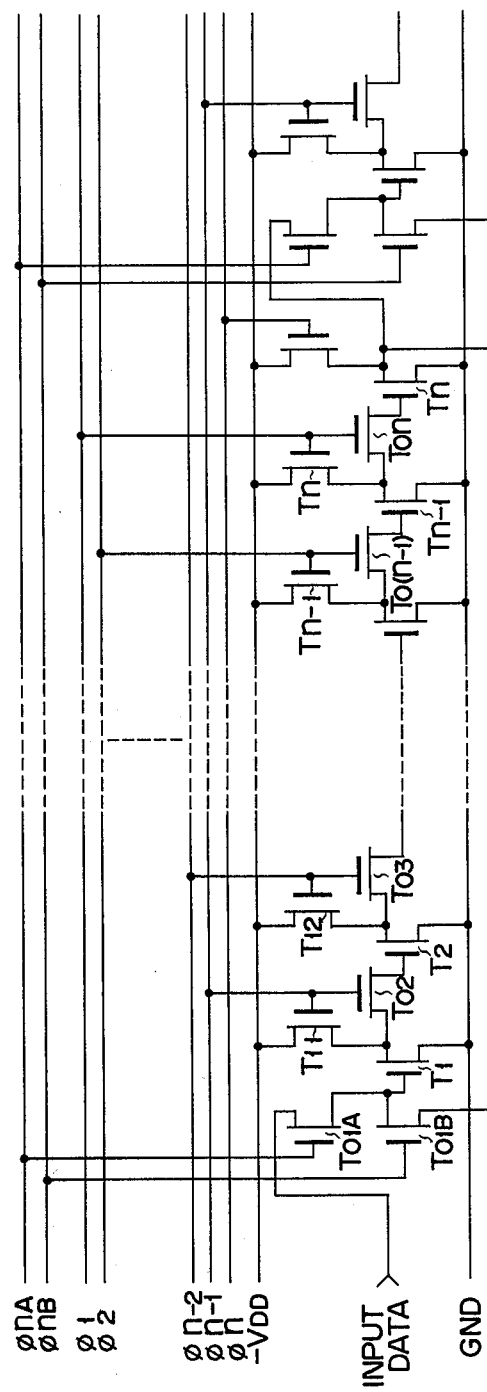

In the embodiment of FIG. 7, an inverter was provided for each register unit $14_1$ to $14_n$ for correction of the polarity of output information therefrom. As shown in FIG. 8, however, the inverter may be omitted. In this case, the final polarity of information introduced is controlled according to the odd or even number of register units through which the information is shifted. In other words, where memory units are provided in an even number, it is unnecessary to reverse the polarity of information introduced. Where the subject information memory device is made to act as a static type, then it is advised to count the number of times information is made to circulate through the shift circulation circuit, namely, to count the number of issued shift pulses $\phi_n$ by a binary counter (now shown), thereby controlling the reversion of the polarity of finally produced information.

In the embodiment of FIG. 7, operation of the subject information memory device as a dynamic or static type was determined by supplying the corresponding shift pulse $\phi_{nA}$ or $\phi_{nB}$. This operation-specifying signal may be formed of a binary coded signal 0 or 1 . To this end, it is possible to use the embodiment of FIG. 9. Unlike the preceding embodiments, the embodiment of FIG. 9 has a switching gate circuit $12a$, for example, provided independently of the transfer element $T_{01}$ of the memory unit $13a$. Said switching gate circuit $12a$ is formed of four field effect transistors $T_{21}$ to $T_{24}$. The transistors $T_{21}$ and $T_{22}$, as well as the transistors $T_{23}$ and $T_{24}$, are connected in series. Both groups of the transistors are further connected in parallel. The gate electrode of the transistor $T_{21}$ is supplied with fresh input information or information read out from the preceding registor unit. The gate electrode of the transistor $T_{23}$ is supplied with information fed back through the shift circulation circuit $16a$. A line 18 is supplied with an instruction for a shift registor to act as a dynamic type upon receipt of a 0 signal and an instruction for said shift register to act as a static type upon receipt of a 1 signal. The line 18 is provided with an inverter 19. a signal from the line 18 is transmitted to the gate electrode of the field effect transistor $T_{24}$, and a signal from the inverter 19 is conducted to the gate electrode of the field effect transistor 22. A field effect transistor 25 acts as a load resistor.

Where a 0 signal is supplied to the line 18, the inverter 19 sends forth a 1 output, and a gating signal is supplied to the gate electrode of the field effect transistor 22.

The result is, input information already supplied to the gate electrode of the transistor 21 is conducted through the transistor $T_{22}$ to the transistor element $T_{01}$ to connect the registor units 14a, 14b ... in series, causing the shift registoer to act as a dynamic type.

Where a 1 signal is delivered to the line 18, the gate of the field effect transistor $T_{24}$ is opened to allow a signal to be fed back through the shift circulation circuit 16a to the transfer element $T_{01}$. Accordingly, the register units $14_1$ to $14_n$ store information independently. Thus the information memory device as a whole acts as a static type.

With the foregoing embodiments, one register unit was formed or five memory units. However, the number of memory units need not be thus limited. Where a series of characters each formed of an N number (N denotes a larger numberal than 3) of bits are stored, it is effective to use a register unit consisting of an (N-1) number of memory units. Counting of the respective cycles of issuing shift pulses $\phi_1$, $\phi_2$ ... can detect the timing in which the respective register units are stored with a character. This counting can effectively detect timing for controlling input and output and changing over the operation of a shift register from a dynamic to a static type or vice versa, and further prominently simplify the control of the subject information memory device. In this case, it is of course necessary to reverse the logical level of an output of information being transmitted from 1 to 0 or vice versa.

With the embodiments of FIGS. 7 and 9, the gate and drain of a field effect transistor acting as a load resistor are directly connected to a power source. However, this invention need not be limited to this arrangement. To save power consumption, it is possible to supply clock pulses to the gate electrode of the field effect transistor or to the gate and drain thereof, instead of connecting said gate and drain to the power source, thereby applying a load only when clock pulses are generated. The same object can be attained by the so-called ratioless circuit in which the source electrode of a memory element is actuated by clock pulses.

All the foregoing embodiments are prominently effective in particularly storing a large amount of information and offers great advantage in being applied as a portable memory medium in place of the conventional tape or card. Further, the information memory device of this invention can be used as convenient portable means for storing parallel recorded characters by arranging them in parallel according to the number of bits constituting each character included in the information.

What is claimed is:

1. An information memory device for storing a pluarl bit data character, comprising:
   a shift register which includes a plurality of cascade connected register units, each register unit having a number N of sequentially arranged memory elements capable of storing digital information, and a number N of sequentially arranged transfer elements respectively coupled to said N memory elements, each of said memory elements and transfer elements being responsive to a supplied shift pulse for transferring digital information stored in a memory element to another memory element via transfer element, N being larger by one than the number of bits in one data character;
   shift pulse generating means for supplying a shift pulse of the same phase to the transfer elements occupying the same sequential position in the respective register units and a number N of shift pulses having different phases to the transfer elements of each register unit from the transfer element disposed on the output side of said register unit;
   shift circulation means coupled to said register units for causing an output delivered from the output terminal of each register unit to circulate through the output terminal of said register unit; and
   input information changeover means including gating means coupled to the input terminal of each register unit for either supplying fresh information to the shift register in order to cause said shift register to act as a dynamic type shift register or circulating information already supplied through said shift circulation means to cause said shift register to act as a static type shift register.

2. The information memory device according to claim 1, wherein said input information changeover gating means comprises a first transfer element which is supplied with an output delivered from each register unit and circulated through the shift circulation circuit and a second transfer element, the output terminal of which is connected to the output terminal of the first transfer element to supply fresh information to the corresponding register unit.

* * * * *